United States Patent
Kim et al.

(10) Patent No.: US 12,228,615 B2
(45) Date of Patent: Feb. 18, 2025

(54) ELECTRONIC DEVICE FOR ESTIMATING BATTERY STATE AND OPERATING METHOD THEREOF

(71) Applicant: Samsung Electronics Co., Ltd., Suwon-si (KR)

(72) Inventors: Jinho Kim, Yongin-si (KR); Tae Won Song, Yongin-si (KR); Young Hun Sung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 330 days.

(21) Appl. No.: 17/720,971

(22) Filed: Apr. 14, 2022

(65) Prior Publication Data
US 2023/0160965 A1    May 25, 2023

(30) Foreign Application Priority Data
Nov. 22, 2021    (KR) .................. 10-2021-0161221

(51) Int. Cl.
*G01R 31/3835*    (2019.01)
*G01R 31/392*    (2019.01)
*H01M 10/48*    (2006.01)

(52) U.S. Cl.
CPC ....... *G01R 31/3835* (2019.01); *G01R 31/392* (2019.01); *H01M 10/482* (2013.01)

(58) Field of Classification Search
CPC .. H01M 10/48; H01M 10/482; G01R 31/392; G01R 31/367; G01R 31/3835; G01R 31/382; G01R 31/3842
See application file for complete search history.

(56) References Cited

U.S. PATENT DOCUMENTS

| | | | |
|---|---|---|---|
| 6,789,026 B2 | 9/2004 | Barsoukov et al. | |
| 6,832,171 B2 | 12/2004 | Barsoukov et al. | |
| 6,892,148 B2 | 5/2005 | Barsoukov et al. | |
| 10,686,321 B2 * | 6/2020 | Ravi | H01M 10/48 |
| 10,718,815 B2 * | 7/2020 | Kim | G01R 31/392 |
| 11,814,030 B2 * | 11/2023 | Vuylsteke | B60L 50/61 |

(Continued)

FOREIGN PATENT DOCUMENTS

| | | |
|---|---|---|
| CN | 107576912 A | 1/2018 |
| JP | 2005-19019 A | 1/2005 |
| JP | 2013-518272 A | 5/2013 |

(Continued)

*Primary Examiner* — An H Do
(74) *Attorney, Agent, or Firm* — NSIP Law

(57) ABSTRACT

Disclosed are an electronic device, including a memory configured to store parameters of an electrochemical model corresponding to a battery, a sensor configured to measure a voltage of the battery, and a processor configured to determine a first cumulative state of charge (SOC) correction amount at a partially discharged point in time at which a SOC of the battery is corrected by a corrector for reducing a voltage difference between an estimated voltage of the electrochemical model and the measured voltage of the battery, estimate a second cumulative SOC correction amount at a fully discharged point in time based on the first cumulative SOC correction amount and a SOC correction amount prediction curve, and update an aging parameter of the electrochemical model based on the second cumulative SOC correction amount.

20 Claims, 15 Drawing Sheets

(56) References Cited

U.S. PATENT DOCUMENTS 11,828,807 B2 * 11/2023 Kim .................... G01R 31/367
2022/0283227 A1   9/2022 Kim et al.

FOREIGN PATENT DOCUMENTS

| JP | 2013-122450 A | 6/2013 |
| JP | 2020-201080 A | 12/2020 |
| KR | 10-2014-0071060 A | 6/2014 |
| WO | WO 2016/079964 A1 | 5/2016 |

* cited by examiner

ELECTRONIC DEVICE FOR ESTIMATING BATTERY STATE AND OPERATING METHOD THEREOF

CROSS-REFERENCE TO RELATED APPLICATIONS

This application claims the benefit under 35 USC § 119(a) of Korean Patent Application No. 10-2021-0161221, filed on Nov. 22, 2021, in the Korean Intellectual Property Office, the entire disclosure of which is incorporated herein by reference for all purposes.

BACKGROUND

1. Field

The following description relates to an electronic device and method for estimating a battery state.

2. Description of Related Art

For optimal battery management, states of batteries may be estimated using various methods. For example, the states of batteries may be estimated by integrating currents of the batteries or by using a battery model (for example, an electric circuit model or an electrochemical model).

In recent years, batteries are being exposed more often to an environment that accelerates aging, such as, fast charging, fast discharging, low-temperature, or high-temperature environment). Thus, there is an increasing need for predicting more accurate aged states of the batteries for battery safety and lifespan extension. State information of batteries reflecting aged states needs to be estimated to accurately predict battery lifetime, service life extension, and for battery safety.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided an electronic device, including a memory configured to store parameters of an electrochemical model corresponding to a battery, a sensor configured to measure a voltage of the battery, and a processor configured to determine a first cumulative state of charge (SOC) correction amount at a partially discharged point in time at which a SOC of the battery is corrected by a corrector for reducing a voltage difference between an estimated voltage of the electrochemical model and the measured voltage of the battery, estimate a second cumulative SOC correction amount at a fully discharged point in time based on the first cumulative SOC correction amount and a SOC correction amount prediction curve, and update an aging parameter of the electrochemical model based on the second cumulative SOC correction amount.

The SOC correction amount prediction curve may be determined based on a cumulative voltage difference curve determined by determining a voltage difference curve between the estimated voltage of the electrochemical model and the measured voltage of the battery based on a change in an anode potential according to aging of the battery, and determining a cumulative voltage difference curve obtained by accumulating voltage differences from a point in time at which the voltage difference increases in the voltage difference curve.

The SOC correction amount prediction curve may be determined based on fixing the voltage difference curve according to the battery and that a cumulative voltage correction amount corresponds to a cumulative SOC correction amount.

The point in time at which the voltage difference increases in the voltage difference curve may include a point in time at which an anode stoichiometry of the battery may be between 0.3 and 0.4, inclusive, or a point in time at which the SOC of the battery may be between 30% and 40%, inclusive.

The processor may be configured to determine the second cumulative SOC correction amount, based on the first cumulative SOC correction amount, a third cumulative SOC correction amount corresponding to a battery state at the partially discharged point in time in the SOC correction amount prediction curve, and a fourth cumulative SOC correction amount corresponding to a battery state at the fully discharged point in time in the SOC correction amount prediction curve.

The processor may be configured to determine the first cumulative SOC correction amount by the corrector from a point in time at which the voltage difference increases to the partially discharged point in time.

The SOC correction amount prediction curve may be determined based on a cumulative voltage difference curve determined by determining a voltage difference curve between a measured voltage of the battery in a fresh state and an estimated voltage of a large-capacity model having a larger capacity than the electrochemical model, and determining a cumulative voltage difference curve obtained by accumulating voltage differences, based on a graph below a designated battery state in the voltage difference curve.

The processor may be configured to store a parameter determined based on the second cumulative SOC correction amount in the memory, and update the aging parameter of the electrochemical model using one or more parameters stored in the memory, in response to an update condition for the aging parameter being reached.

The aging parameter may include an electrode balance shift for the battery.

The processor may be configured to estimate state information of the battery using the electrochemical model with the updated aging parameter.

In another general aspect, there is provided a processor-implemented method of operating an electronic device, the operating method including determining a first cumulative state of charge (SOC) correction amount at a partially discharged point in time at which a SOC of a battery included in the electronic device is corrected by a corrector for reducing a voltage difference between an estimated voltage of an electrochemical model corresponding to the battery and a measured voltage of the battery, estimating a second cumulative SOC correction amount at a fully discharged point in time based on the first cumulative SOC correction amount and a SOC correction amount prediction curve, and updating an aging parameter of the electrochemical model based on the second cumulative SOC correction amount.

The SOC correction amount prediction curve may be determined based on a cumulative voltage difference curve determined by determining a voltage difference curve between the estimated voltage of the electrochemical model and the measured voltage of the battery based on a change in an anode potential according to aging of the battery, and determining a cumulative voltage difference curve obtained by accumulating voltage differences from a point in time at which the voltage difference increases in the voltage difference curve.

The SOC correction amount prediction curve may be determined based on fixing the voltage difference curve according to the battery and that a cumulative voltage correction amount corresponds to a cumulative SOC correction amount.

The point in time at which the voltage difference increases in the voltage difference curve may include a point in time at which an anode stoichiometry of the battery may be between 0.3 and 0.4, inclusive, or a point in time at which the SOC of the battery may be between 30% and 40%, inclusive.

The estimating of the second cumulative SOC correction amount may include determining the second cumulative SOC correction amount, based on the first cumulative SOC correction amount, a third cumulative SOC correction amount corresponding to a battery state at the partially discharged point in time in the SOC correction amount prediction curve, and a fourth cumulative SOC correction amount corresponding to a battery state at the fully discharged point in time in the SOC correction amount prediction curve.

The determining of the first cumulative SOC correction amount may include determine the first cumulative SOC correction amount by the corrector from a point in time at which the voltage difference increases to the partially discharged point in time.

The SOC correction amount prediction curve may be determined based on a cumulative voltage difference curve determined by determining a voltage difference curve between a measured voltage of the battery in a fresh state and an estimated voltage of a large-capacity model having a larger capacity than the electrochemical model, and determining a cumulative voltage difference curve obtained by accumulating voltage differences, based on a graph below a designated battery state in the voltage difference curve.

The operating method may include storing a parameter determined based on the second cumulative SOC correction amount in a memory, and updating the aging parameter of the electrochemical model using one or more parameters stored in the memory, in response to an update condition for the aging parameter being reached.

The aging parameter may include an electrode balance shift for the battery.

Other features and aspects will be apparent from the following detailed description, the drawings, and the claims.

Figure 1:
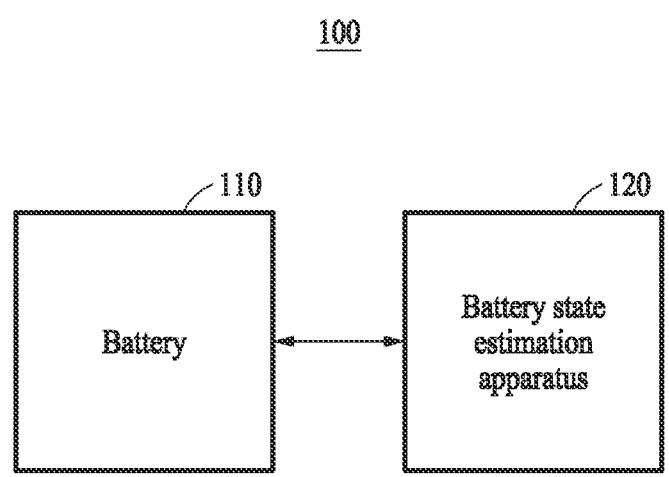
FIG. 1 illustrates an example of a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third", A, B, C, (a), (b), (c), or the like may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in the examples described herein may also be referred to as a second member, component, region, layer, or section without departing from the teachings of the examples.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

The terminology used herein is for describing various examples only and is not to be used to limit the disclosure. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or populations thereof.

The use of the term "may" herein with respect to an example or embodiment (e.g., as to what an example or embodiment may include or implement) means that at least one example or embodiment exists where such a feature is included or implemented, while all examples are not limited thereto.

Hereinafter, examples will be described in detail with reference to the accompanying drawings. When describing the examples with reference to the accompanying drawings, like reference numerals refer to like elements and a repeated description related thereto will be omitted.

FIG. 1 illustrates an example of a battery apparatus.

Referring to FIG. 1, a battery apparatus 100 includes a battery 110 and a battery state estimation apparatus 120.

The battery 110 may be one or more battery cells, battery modules, or battery packs, and may be a rechargeable battery.

The battery state estimation apparatus 120 may be an apparatus for estimating a battery state for optimal management of the battery 110 and include, for example, a battery management system (BMS). The battery state estimation apparatus 120 senses the battery 110 using one or more sensors, i.e., the battery state estimation apparatus 120 collects sensing data obtained by sensing the battery 110. For example, the sensing data may include any one or any combination of voltage data, current data, and temperature data.

The battery state estimation apparatus 120 may estimate state information of the battery 110 based on the sensing data and output a result of the sensing. The state information may include, for example, any one or any combination of a state of charge (SOC), a relative state of charge (RSOC), a state of health (SOH), and abnormality state information. A battery model used to estimate the state information is an electrochemical model, which will be described later with reference to FIG. 2.

Since the available region of the battery 110 may expand according to the accuracy of estimating the state information of the battery 110, estimating accurate state information of the battery 110 may be an integral component of the battery state estimation apparatus 120. The battery state estimation apparatus 120 may reflect in the battery model an accurate aged state of the battery 110, thereby estimating state information, which accurately reflects the aged state of the battery 110.

There are various factors that affect the aging of the battery 110, such as an increase in simple resistance component, a decrease in amount of cathode or anode active material, and an occurrence of lithium (Li) plating. The aging of the battery 110 may vary depending on a pattern of usage of the battery, and a usage environment. In an example, aging characteristics of the battery 110 may vary depending on the use form of the user who uses the battery and the environment. For example, even if the battery 110 has the same reduction in the capacity due to aging, the internal state of the aged battery 110 may be different. In order to accurately reflect aging in the battery model, aging parameters of the battery estimated through an analysis of response characteristics (for example, voltage, etc.) of the battery aged depending on a user may be updated to the battery model. The accuracy of the state information of the battery 110 that is estimated by the battery state estimation apparatus 120 may be used in the optimal management and control of the battery 110.

However, it may be difficult to estimate some aging parameters in an actual battery usage environment of the user. For example, an electrode balance shift, which is one of the aging parameters, may be estimated at a low SOC or anode stoichiometry like at a fully discharged point in time, and a corresponding estimation condition may not be easily achieved according to an actual battery use pattern of the user. Accordingly, there is a need for a method of accurately estimating the electrode balance shift even at a partially discharged point in time before the fully discharged point in time is reached, which will be described in detail with reference to the following drawings.

Figure 2:
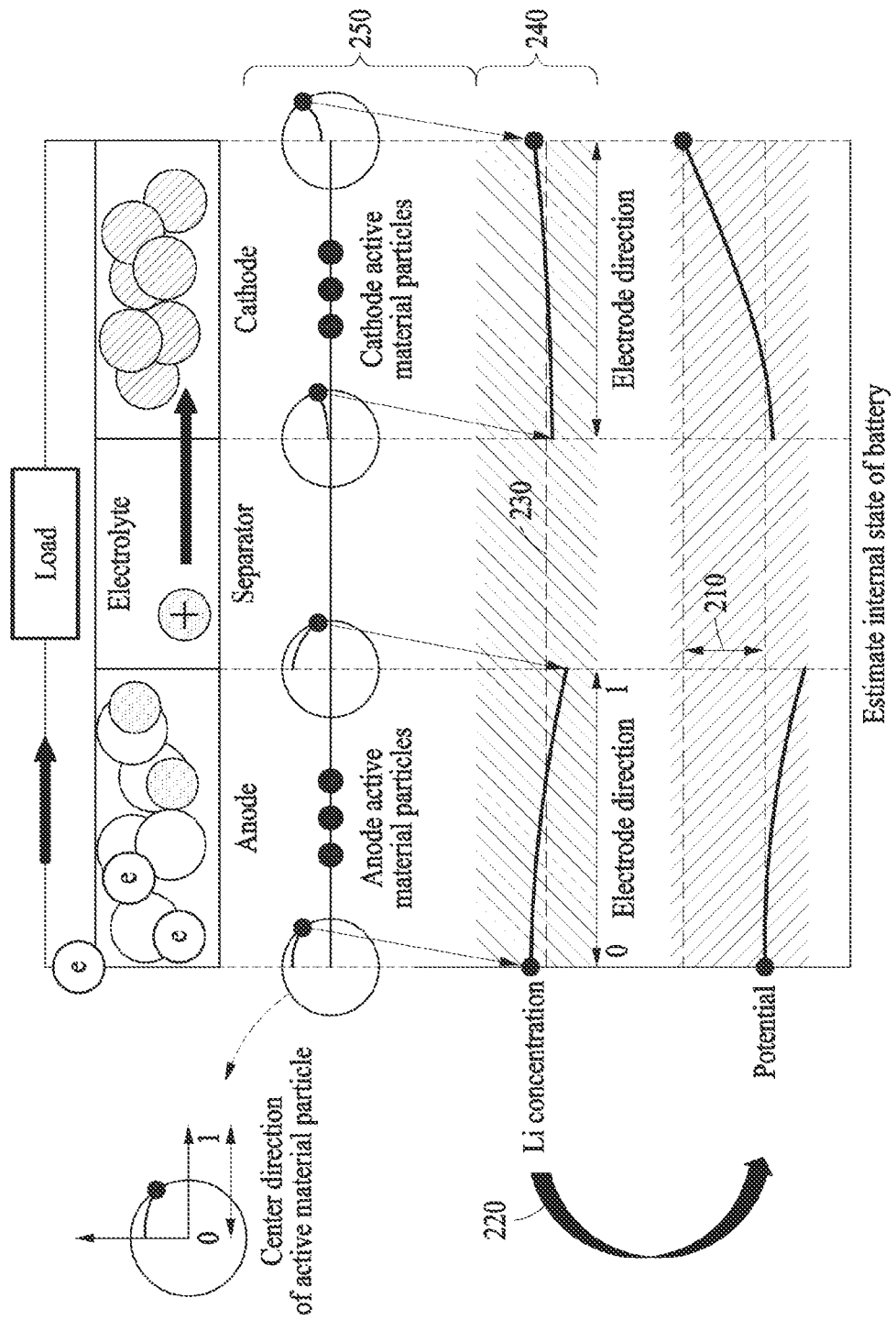
FIG. 2 illustrates an example of an electrochemical model.

FIG. 2 illustrates an example of an electrochemical model.

Referring to FIG. 2, an electrochemical model may estimate a residual capacity of a battery by modeling internal physical phenomena of the battery, such as an ion concentration, a potential, and the like. In other words, the electrochemical model may be represented by a physical conservation equation associated with an electrochemical reaction occurring on an electrode/electrolyte interface, an electrode/electrolyte concentration, and the conservation of electrical charges. For this, various model parameters such as a shape (for example, thickness, radius, etc.), an open circuit potential (OCP), and a physical property value (for example, electrical conductance, ionic conductance, diffusion coefficient, etc.) may be used.

In the electrochemical model, various state variables, such as a concentration and a potential, may be coupled to one another. An estimated voltage 210 estimated by the electrochemical model may be a potential difference between both ends which are a cathode and an anode. As indicated by an arrow 220, potential information of each of the cathode and the anode may be affected by the ion concentration distribution of each of the cathode and the anode. A SOC 230 that is estimated by the electrochemical model is an average ion concentration of the cathode and the anode.

Here, the ion concentration distribution may be an ion concentration distribution 240 in an electrode or an ion concentration distribution 250 in an active material particle present at a position in the electrode. The ion concentration distribution 240 in the electrode may be a surface ion concentration distribution or an average ion concentration distribution of an active material particle positioned in an electrode direction, and the electrode direction may be a direction connecting one end of the electrode (e.g., a boundary adjacent to a collector) and the other end of the electrode (e.g., a boundary adjacent to a separator). In addition, the ion concentration distribution 250 in the active material particle may be an ion concentration distribution within the active material particle according to a center direction of the active material particle, and the center direction of the active material particle may be a direction connecting the center of the active material particle and the surface of the active material particle.

To reduce the voltage difference between the measured voltage and the estimated voltage of the battery, the ion concentration distribution of each of the cathode and the anode may be shifted while maintaining the physical conservation associated with concentration, the potential information of each of the cathode and the anode may be derived based on the shifted concentration distribution, and the voltage may be calculated based on the derived potential information of each of the cathode and the anode. The current SOC of the battery may be determined by deriving an internal state shift amount that makes the voltage difference be "0".

Figure 3:
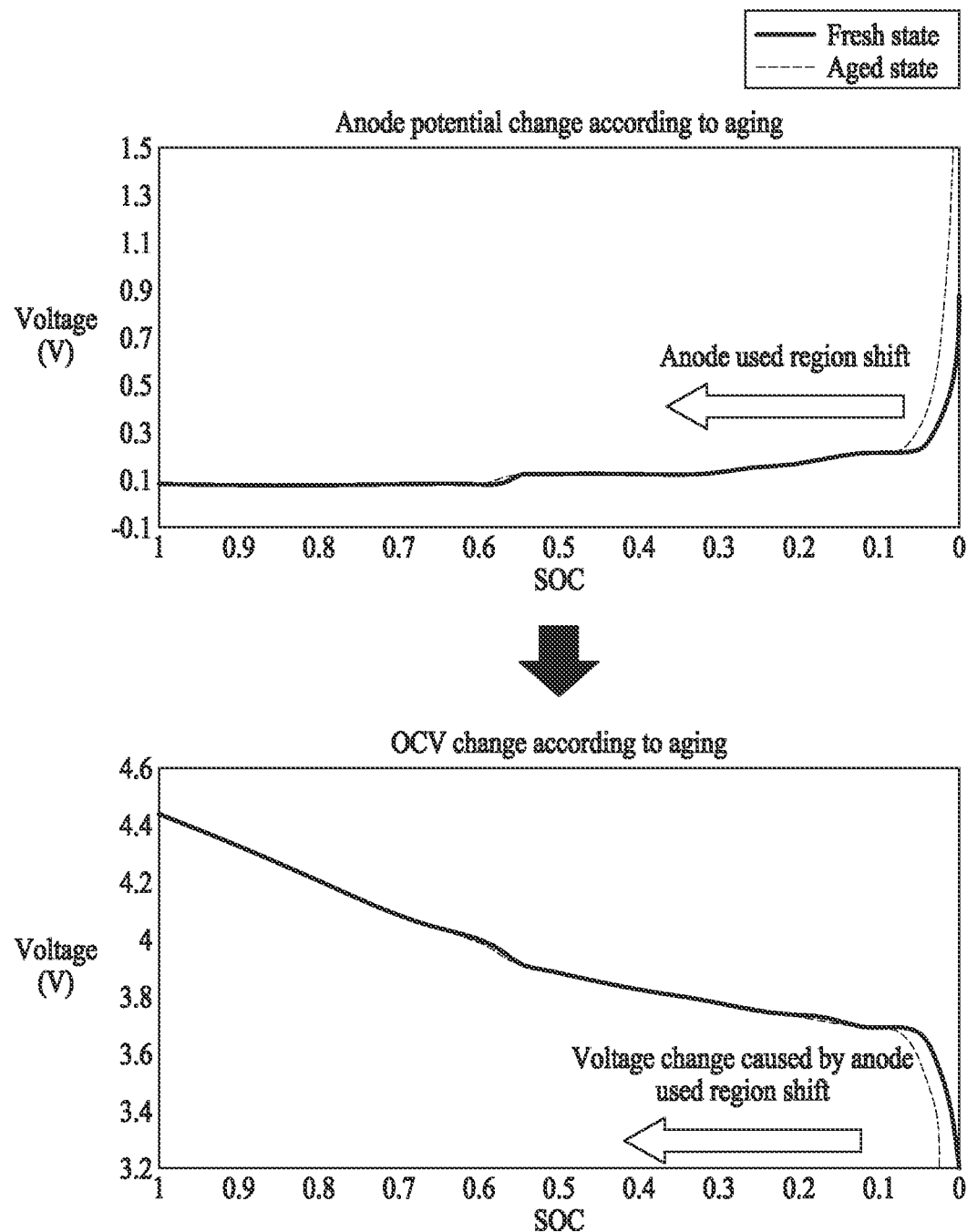
FIGS. 3 to 5 illustrate examples of operations of a corrector.
Figure 4:
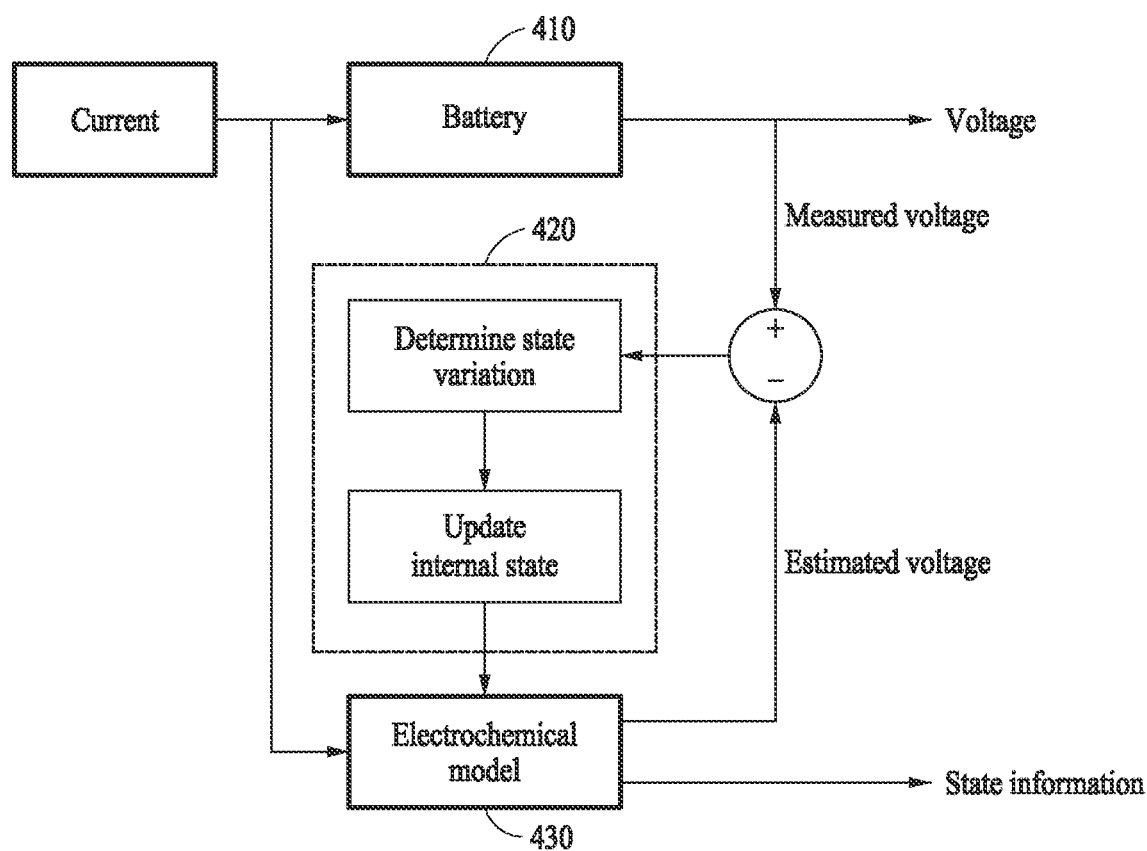
Figure 5:
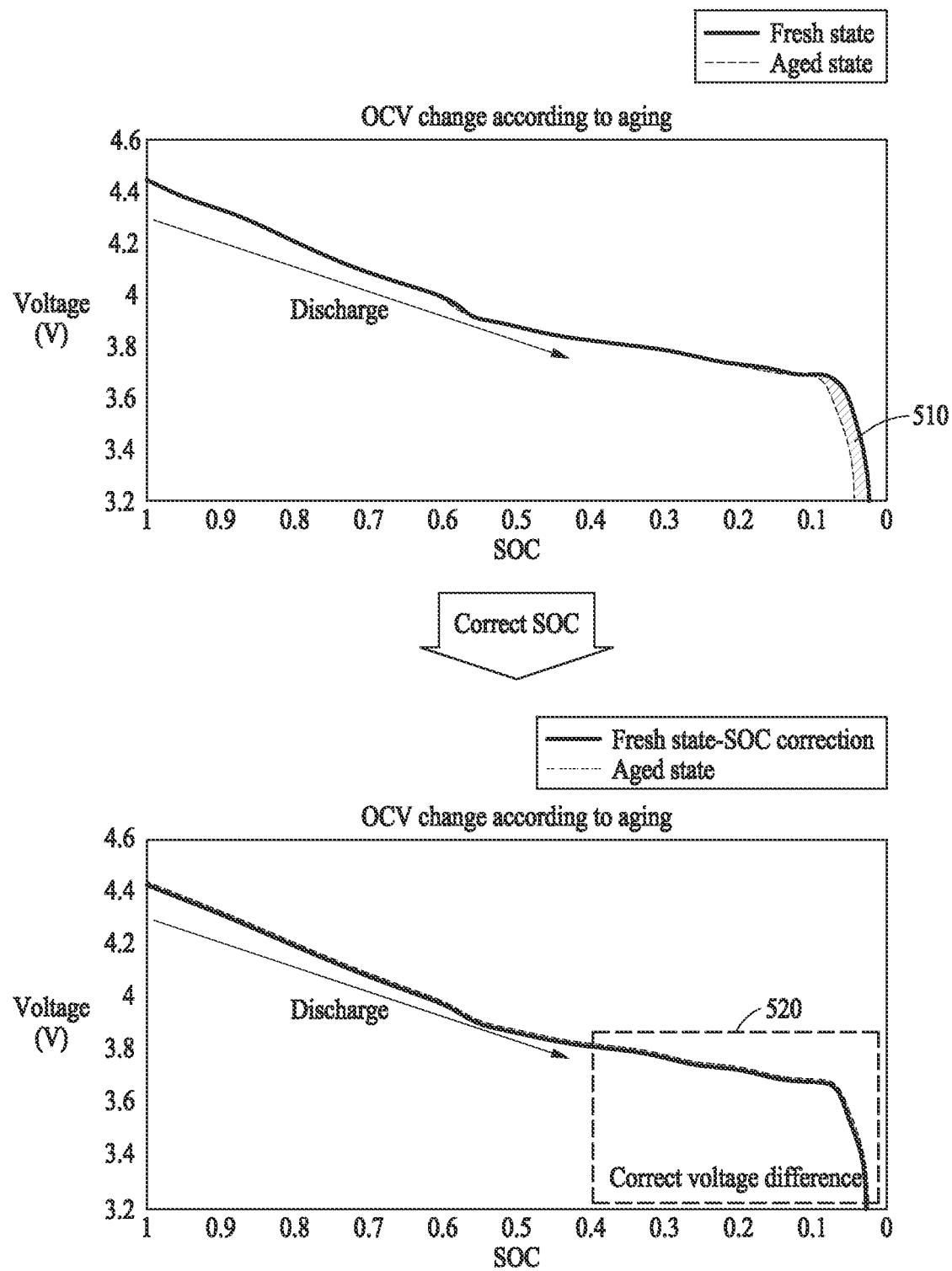

FIGS. 3 to 5 illustrate examples of operations of a corrector.

Referring to FIG. 3, anode potentials (e.g., open circuit potentials (OCPs)) and cell voltages (e.g., open circuit voltages (OCVs)) in a fresh state in which a battery is not aged and in an aged state in which the battery is aged are shown.

The electrode balance shift is a characteristic that a used region of the anode is shifted at a cathode-anode potential difference which determines the voltage of the battery, which may cause a change in the OCV characteristic of the battery, which may be due to a change in the anode potential.

In other words, the cathode potential may show a slight difference between the fresh state and the aged state, whereas the anode potential may have a great difference between the fresh state and the aged state at a low SOC. The anode potential in the aged state may be in a shape that is shifted leftward from the anode potential in the fresh state, which may be referred to as an electrode balance shift.

A cell voltage graph indicates a battery is used and discharged. A difference between a voltage in the fresh state and a voltage in the aged state may be larger at a low SOC at the end of discharging than at a high SOC at the beginning of discharging. In particular, at a low SOC, a drastic change in the voltage difference between the fresh state and the aged state may occur. The cause may be found in the electrode balance shift.

When the battery model does not reflect the current aged state well whereas the actual battery is aged by the electrode balance shift, the cell voltage graphs of the fresh state and the aged state shown in FIG. 3 may represent the estimated voltage of the electrochemical model and the measured voltage of the battery that do not reflect the current aged state properly. A difference between the estimated voltage of the electrochemical model and the measured voltage of the battery may be reduced by the corrector, and an operation of the corrector will be described in detail with reference to FIG. 4.

Referring to FIG. 4, a corrector 420 may correct an internal state of an electrochemical model 430 when an error between an estimated voltage of a battery 410 estimated by the electrochemical model 430 and a measured voltage of the battery 410 occurs.

The battery state estimation apparatus may estimate state information of the battery 410 using the electrochemical model 430 corresponding to the battery 410. The electrochemical model 430 may be a model that estimates state information of the battery 410 by modeling an internal physical phenomenon, such as a potential or an ion concentration distribution, of the battery 410.

The accuracy of estimating the state information of the battery 410 may affect the optimal management and control of the battery 410. When the state information is estimated using the electrochemical model 430, an error between sensor information obtained by measuring current, voltage, and temperature data to be input into the electrochemical model 430 and state information calculated using a modeling scheme may occur. Thus, the corrector 420 may correct the error.

In an example, a voltage difference between the measured voltage of the battery 410 measured by a sensor and the estimated voltage of the battery 410 estimated by the electrochemical model 430 may be determined.

The corrector 420 may determine a state variation of the battery 410 based on the voltage difference, previous state information previously estimated by the electrochemical model 430, and an open circuit voltage (OCV) table. The corrector 420 may obtain an open circuit voltage corresponding to the previous state information based on the OCV table, and determine the state variation of the battery 410 by reflecting the voltage difference in the open circuit voltage. For example, the state variation may include a SOC variation.

The corrector 420 may update the internal state of the electrochemical model 430 based on the state variation. For example, the internal state of the electrochemical model 430 may include one of a voltage, an overpotential, a SOC, a cathode lithium ion concentration distribution, an anode lithium ion concentration distribution, and an electrolyte lithium ion concentration distribution of the battery 410, or a combination of two or more thereof. In an example, internal state of the electrochemical model 430 may be in the form of a profile. The corrector 420 may update the internal state of the electrochemical model 430 by correcting an ion concentration distribution within an active material particle or an ion concentration distribution in an electrode based on the state variation of the battery 410.

The battery state estimation apparatus may estimate state information of the battery 410 based on the updated internal state of the electrochemical model 430.

As described above, the battery state estimation apparatus may estimate the state information of the battery 410 at high accuracy without increasing the complexity and computation amount of the model, through a feedback structure that updates the internal state of the electrochemical model 430 by determining the state variation of the battery 410 such that the voltage difference between the measured voltage of the battery 410 and the estimated voltage of the battery 410 estimated by the electrochemical model 430 is minimized.

The operation of the corrector 420 described above may be used to estimate and update the electrode balance shift, which will be described in detail with reference to FIG. 5.

Referring to FIG. 5, cell voltages in a fresh state, an aged state, and a state in which SOC correction is performed in the fresh state are shown.

When estimating state information (e.g., a SOC) of a battery in an electrochemical model, an estimated voltage (e.g., the cell voltage in the fresh state shown in FIG. 5) of the electrochemical model may be corrected to match a measured voltage (e.g., the cell voltage in the aged state shown in FIG. 5) of the battery. In an example, a voltage difference between the measured voltage and the estimated voltage may be reduced through the SOC correction by the electrochemical model. A cumulative SOC correction amount is a value for compensating for a voltage difference by the electrode balance shift, and a battery state estimation apparatus may use a degree in which state information of the battery is corrected by a corrector, to estimate and update an electrode balance shift which is an aging parameter.

The cumulative SOC correction amount may be determined based on a degree 510 in which the cell voltage in the fresh state is to be corrected to the cell voltage in the aged state by the corrector. Using a characteristic that the cumulative SOC correction amount by the corrector is determined according to a degree of aging of the battery, the battery state estimation apparatus may update an aging parameter of the electrochemical model by converting a cumulative SOC correction amount by the corrector in an interval into an electrode balance shift value. The interval may be a region 520 in which the voltage difference is corrected by the corrector, and for example, a starting point of the interval may be between 30% and 40%, inclusive, for a SOC or between 0.3 and 0.4, inclusive, for an anode stoichiometry.

As such, the electrode balance shift may be determined based on the cumulative SOC correction amount up to a fully discharged point in time, and the battery may be charged first before the battery reaches the fully discharged point in time according to a use pattern or environment of a user of the battery. Here, the fully discharged point in time may correspond to a SOC value when a discharge cutoff voltage is reached during standard discharge at room temperature. The electrode balance shift may be accurately estimated based on estimating a cumulative SOC correction amount at the fully discharged point in time from a cumulative SOC correction amount until a partially discharged point in time before the fully discharged point in time is reached. An operation of estimating the cumulative SOC correction amount at the fully discharged point in time from the cumulative SOC correction amount at the partially discharged point in time and estimating the electrode balance shift using the same will be described in detail with reference to the following drawings.

Figure 6:
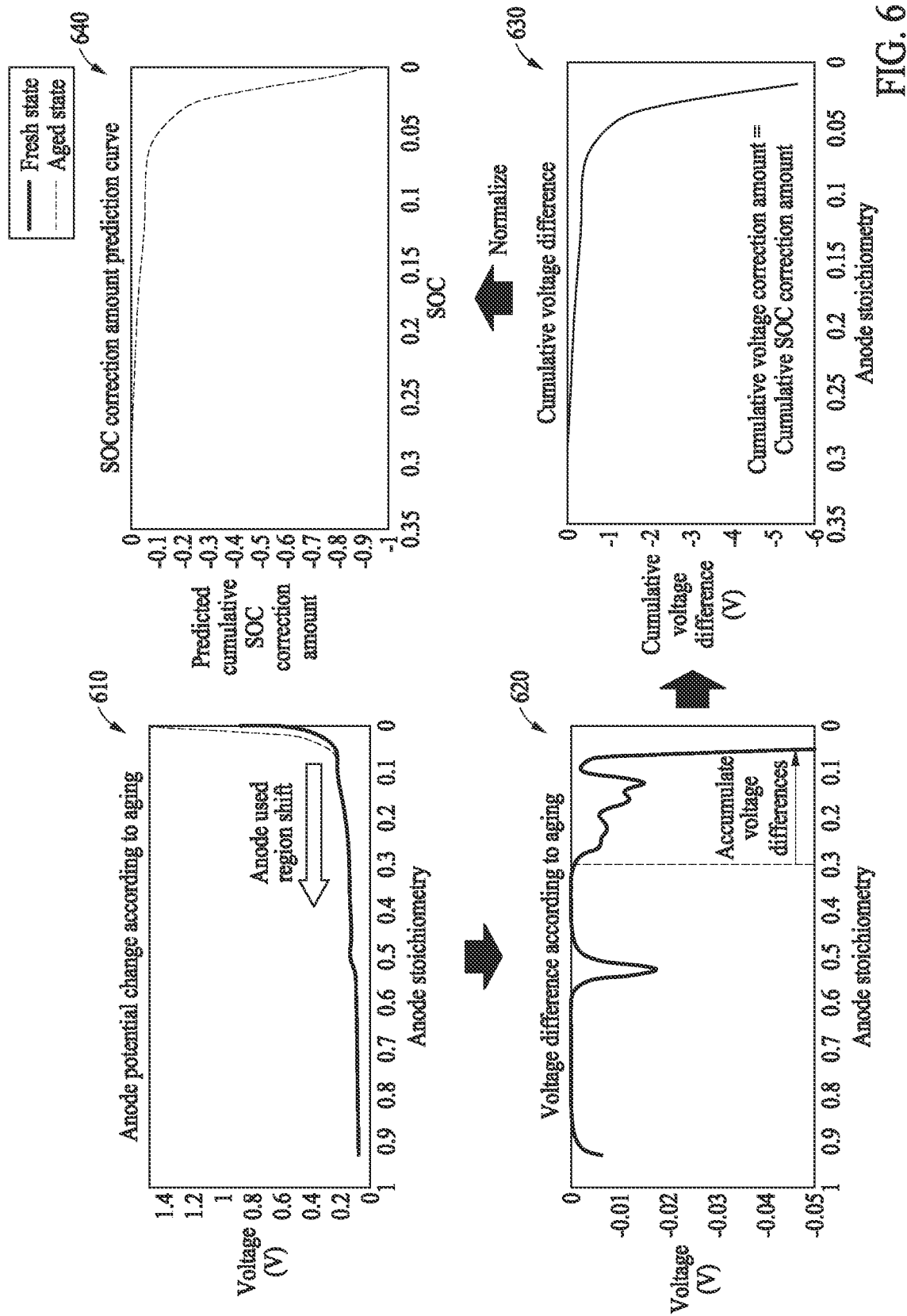
FIG. 6 illustrates an example of determining a state of charge (SOC) correction amount prediction curve.

FIG. 6 illustrates an example of determining a state of charge (SOC) correction amount prediction curve.

Referring to FIG. 6, a SOC correction amount prediction curve 640 may be determined to estimate a second cumulative SOC correction amount at a fully discharged point in time from a first cumulative SOC correction amount at a partially discharged point in time. In FIG. 6, the x-axis of the graphs is denoted as an anode stoichiometry for ease of description, but the x-axis may be expressed as a SOC according to an example. The anode stoichiometry corresponds to a lithium concentration of the battery and may have an absolute value, while a SOC is a relative value and may be designated as 0 to 100% at a different position depending on an application.

When a battery is aged due to an electrode balance shift, based on a characteristic that a voltage difference between a cell voltage in an aged state (e.g., an estimated voltage of a battery model in an assumed aged state or a measured voltage of the aged battery) and a cell voltage in a fresh state (e.g., an estimated voltage of an electrochemical model not reflecting aging) has a pattern, a SOC correction amount prediction curve 640 may be determined. Being aged due to an electrode balance shift may be a shift of a used region of an anode, and an anode potential caused by the shift may be the same as a voltage corrected when estimating the electrode balance shift. In other words, the value of the electrode balance shift may correspond to the characteristic of the anode potential difference caused by the shift.

An interval in which the electrode balance shift can be estimated is a region in which the anode potential difference significantly increases, and may be, for example, an interval in which the anode stoichiometry is 0.3 or less. In other words, the electrode balance shift may be estimated in an interval in which the anode stoichiometry X<0.3, and an interval in which X<0.3 during 0.5C-rate (current rate) discharge may correspond to an interval in which the SOC is 40% or less. However, a starting point of the interval in which the electrode balance shift can be estimated is not limited to X=0.3, and the starting point may be X=0.3 to 0.4 in some examples.

A voltage difference graph 620 according to aging shown in FIG. 6 shows a voltage difference between an anode potential in a fresh state and an anode potential in an aged state and may be derived by an anode potential change graph 610 according to aging. The shapes of the graphs may be determined according to a battery in use. In other words, the voltage difference graph 620 according to aging may have the same shape for batteries having the same characteristics (e.g., battery material, etc.). A cumulative SOC correction amount used to estimate an electrode balance shift is obtained by accumulating SOC values corrected to correct a voltage difference (or an anode potential difference), and may have a predetermined pattern if the voltage difference graph 620 according to aging is fixed.

A cumulative voltage difference graph 630 may be determined by accumulating voltage differences from a point in time in the voltage difference graph 620 according to aging. The point in time is a point in time at which the voltage difference starts to gradually increase in the voltage difference graph 620 according to aging, and may be, for example, a point in time at which the anode stoichiometry X is between 0.3 and 0.4, inclusive, as described above. Although the cumulative voltage difference graph 630 has a peak in an interval in which the anode stoichiometry is 0.50 to 0.55, it is difficult to predict a cumulative SOC correction amount for the interval. Thus, voltage differences during the interval may not be accumulated.

Since the cumulative SOC correction amount for estimating the electrode balance shift is based on the same characteristics as the cumulative voltage difference graph 630 corresponding to the cumulative SOC correction amount is, the SOC correction amount prediction curve 640 may be determined from the cumulative voltage difference graph 630. For example, the SOC correction amount prediction curve 640 may be determined by normalizing a y-axis data range of the cumulative voltage difference graph 630. The cumulative voltage difference graph 630 is normalized to reduce data usage for data processing, and in some examples, the SOC correction amount prediction curve 640 may be determined to be the same as the cumulative voltage difference graph 630.

Since the SOC correction amount prediction curve 640 has a fixed pattern according to battery characteristics, the SOC correction amount prediction curve 640 may be determined before estimating the electrode balance shift, and the determined SOC correction amount prediction curve 640 may be applied when estimating the electrode balance shift.

Figure 7:
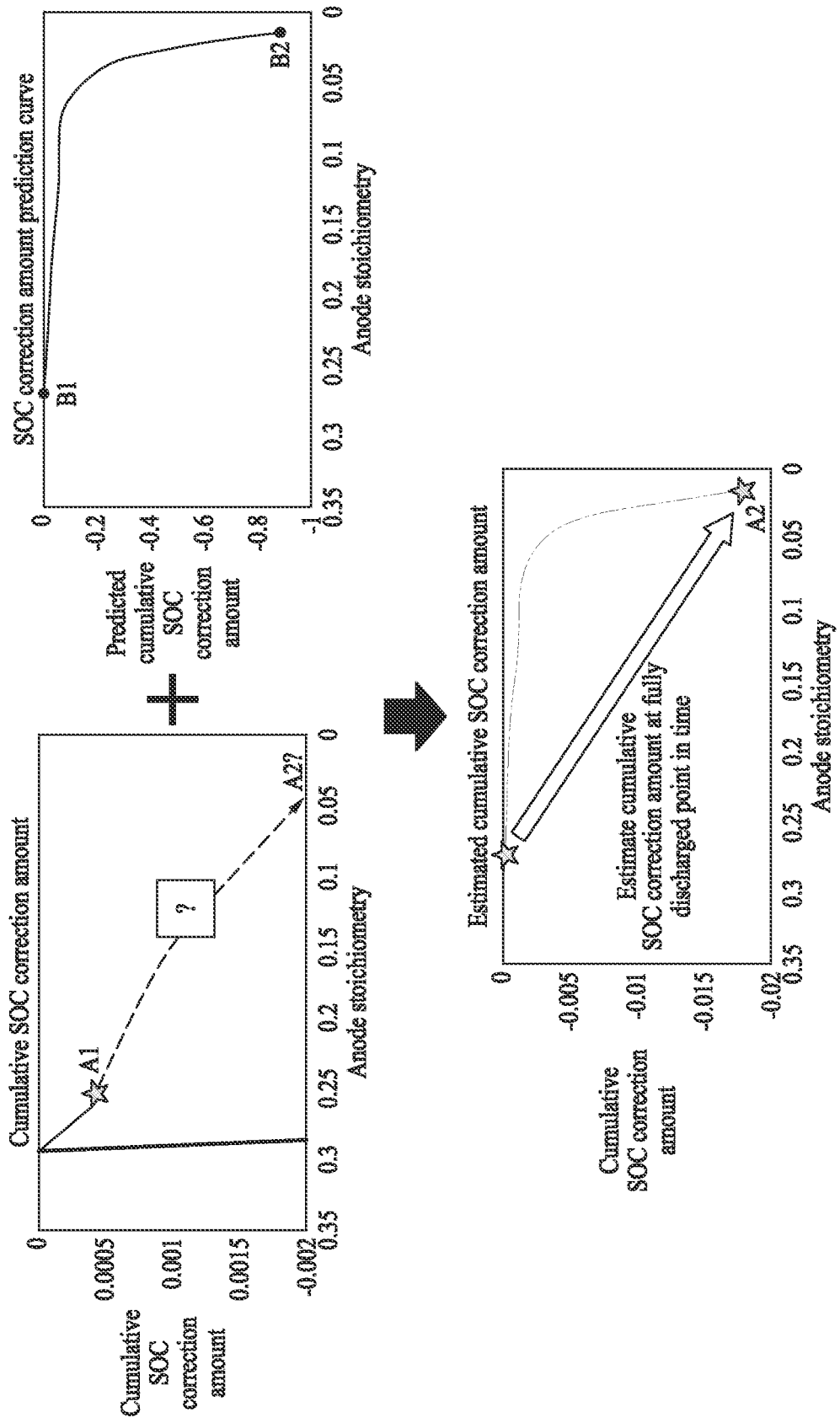
FIG. 7 illustrates an example of estimating a cumulative SOC correction amount.

FIG. 7 illustrates an example of estimating a cumulative SOC correction amount.

Referring to FIG. 7, an example of estimating a second cumulative SOC correction amount A2 at a fully discharged point in time from a first cumulative SOC correction amount A1 at a partially discharged point in time based on a SOC correction amount prediction curve is shown.

The first cumulative SOC correction amount A1 measured at a current partially discharged point in time may be measured. For example, the current partially discharged point in time is a not-fully discharged point in time point at which an anode stoichiometry X is 0.3 or less, and may be a point in time at which a SOC is between 15% and 40%, inclusive, but is not limited thereto.

In FIG. 6, a third cumulative SOC correction amount B1 corresponding to a battery state (e.g., the anode stoichiometry, the SOC, etc.) at a current partially discharged point in time may be determined in the SOC correction amount prediction curve of FIG. 6. In addition, a fourth cumulative SOC correction amount B2 corresponding to a battery state at the fully discharged point in time may be determined in the SOC correction amount prediction curve. The battery state at the fully discharged point in time may be a SOC or an anode stoichiometry when a discharge cutoff voltage is reached during standard discharge at room temperature.

The second cumulative SOC correction amount A2 at the fully discharged point in time may be determined based on Equation 1 below.

$$A2 = A1\frac{B2}{B1} \quad \text{[Equation 1]}$$

The second cumulative SOC correction amount A2 at the fully discharged point in time may be converted into an electrode balance shift value based on Equation 2 below.

$$\text{Electrode Balance Shift} = A2 \times (X_{SOC100\%} - X_{SOC0\%}) \quad \text{[Equation 2]}$$

In Equation 2 above, XSOC100% may be an anode stoichiometry value corresponding to a SOC of 100%, and XSOC0% may be an anode stoichiometry value corresponding to a SOC of 0%.

Figure 8:
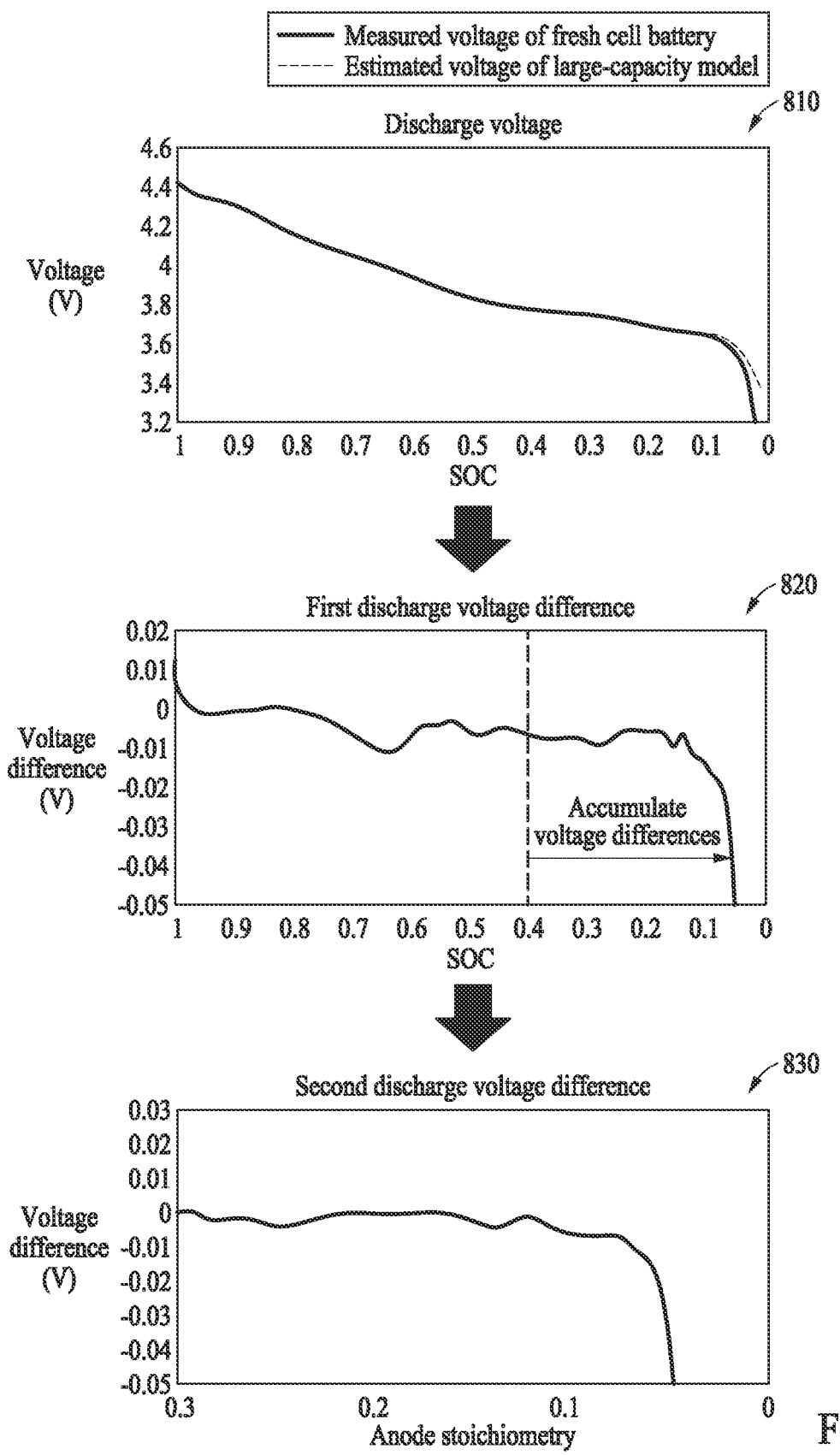
FIGS. 8 and 9 illustrate an example of determining a SOC correction amount prediction curve.
Figure 9:
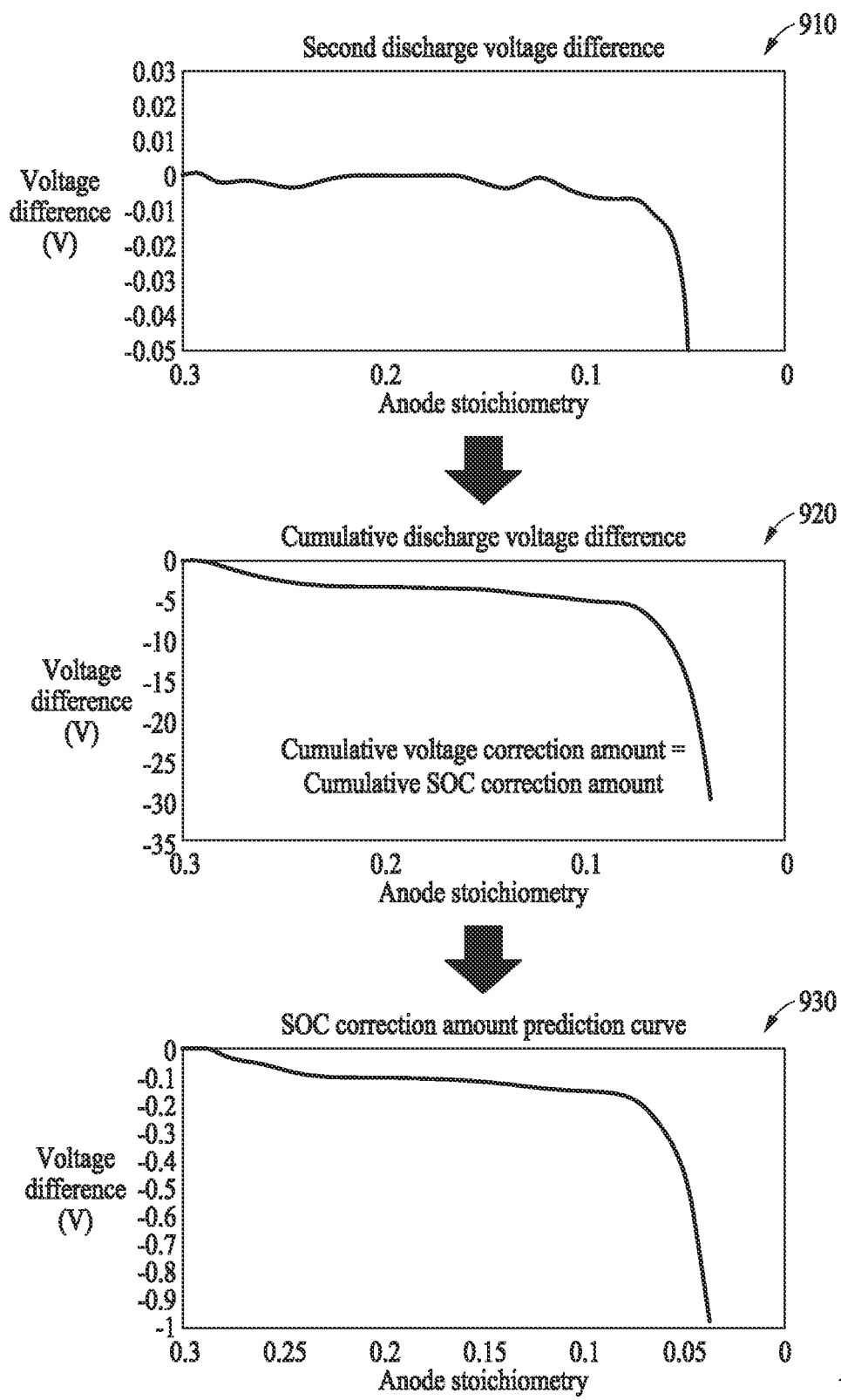

FIGS. 8 and 9 illustrate an example of determining a SOC correction amount prediction curve.

The operation of determining the SOC correction amount prediction curve 640 described with reference to FIG. 6 may be based on the assumption that a measured voltage of an actual fresh cell battery and an estimated voltage of an electrochemical model in a fresh state are the same or substantially similar to each other. In other words, applying the assumption that there is no or considerably small model error, the anode potential change graph 610 may be used to determine the SOC correction amount prediction curve 640.

Since without the above assumption, for example, the measured voltage of the actual fresh cell battery and the estimated voltage of the battery model in the fresh state are not the same due to a model error, the model error may be reflected in a voltage difference graph used to determine the SOC correction amount prediction curve, which will be described below.

Referring to FIG. 8, an example of determining a second discharge voltage difference graph 830 reflecting a model error is shown.

A discharge voltage graph 810 may illustrate measured voltage of a fresh cell battery and an estimated voltage of a large-capacity model, during low-current discharge (e.g., 0.2C discharge). The large-capacity model may be a model with a model capacity intentionally increased by adjusting capacity parameters of an electrochemical model. For example, the capacity of the large-capacity model may be about 102% of the capacity of the electrochemical model, but is not limited thereto.

The electrochemical model may need to be updated when aging by an electrode balance shift causes a voltage difference between the fresh model and the aged cell battery. Here, the fresh model may correspond to a state of being less aged and having a larger battery capacity than the aged cell battery, and the aged cell may correspond to a state of being more aged and having a smaller battery capacity than the fresh cell. To determine a voltage difference curve, data from a high-capacity model with a larger battery capacity and a cell battery having a relatively smaller battery capacity may be required. For example, if the anode moves in a negative direction when aging by the electrode balance shift occurs, a large-capacity model may be implemented by shifting the anode by an amount corresponding to a SOC of 2% in a positive direction. In another example, a large-capacity model may be implemented by enlarging an electrode area parameter, of the model parameters, to a level of 102%.

A first discharge voltage difference graph 820 may represent a difference between the measured voltage of the fresh cell battery and the estimated voltage of the large-capacity model shown in the discharge voltage graph 810. The first discharge voltage difference graph 820 from a point in time may be used to determine a cumulative discharge voltage difference 920 of FIG. 9. As described above, the point in time may be a point in time when a SOC is between 30% and 40%, inclusive. However, in FIG. 8, for ease of description, the point in time may be determined to be a point in time when a SOC is 40%.

The second discharge voltage difference graph 830 shows only a part of the graph after the point in time in the first discharge voltage difference graph 820 with respect to an anode stoichiometry, and an offset value may be applied to a voltage difference value at the point in time to make the voltage difference value to be "0".

Referring to FIG. 9, an example of determining a SOC correction amount prediction curve 930 from a second discharge voltage difference graph 910 is shown. The cumulative discharge voltage difference graph 920 may be determined by accumulating voltage differences from a predetermined point in time point (e.g., anode stoichiometry X=0.3) in the second voltage difference graph 910. The SOC correction amount prediction curve 930 may be determined based on the cumulative discharge voltage difference graph 920. For example, the SOC correction amount prediction curve 930 may be determined by normalizing a y-axis data range of the cumulative discharge voltage difference graph 920. The cumulative discharge voltage difference graph 920 is normalized to reduce data usage for data processing, and in some examples, the SOC correction amount prediction curve 930 may be determined to be the same as the cumulative discharge voltage difference graph 920.

Figure 10:
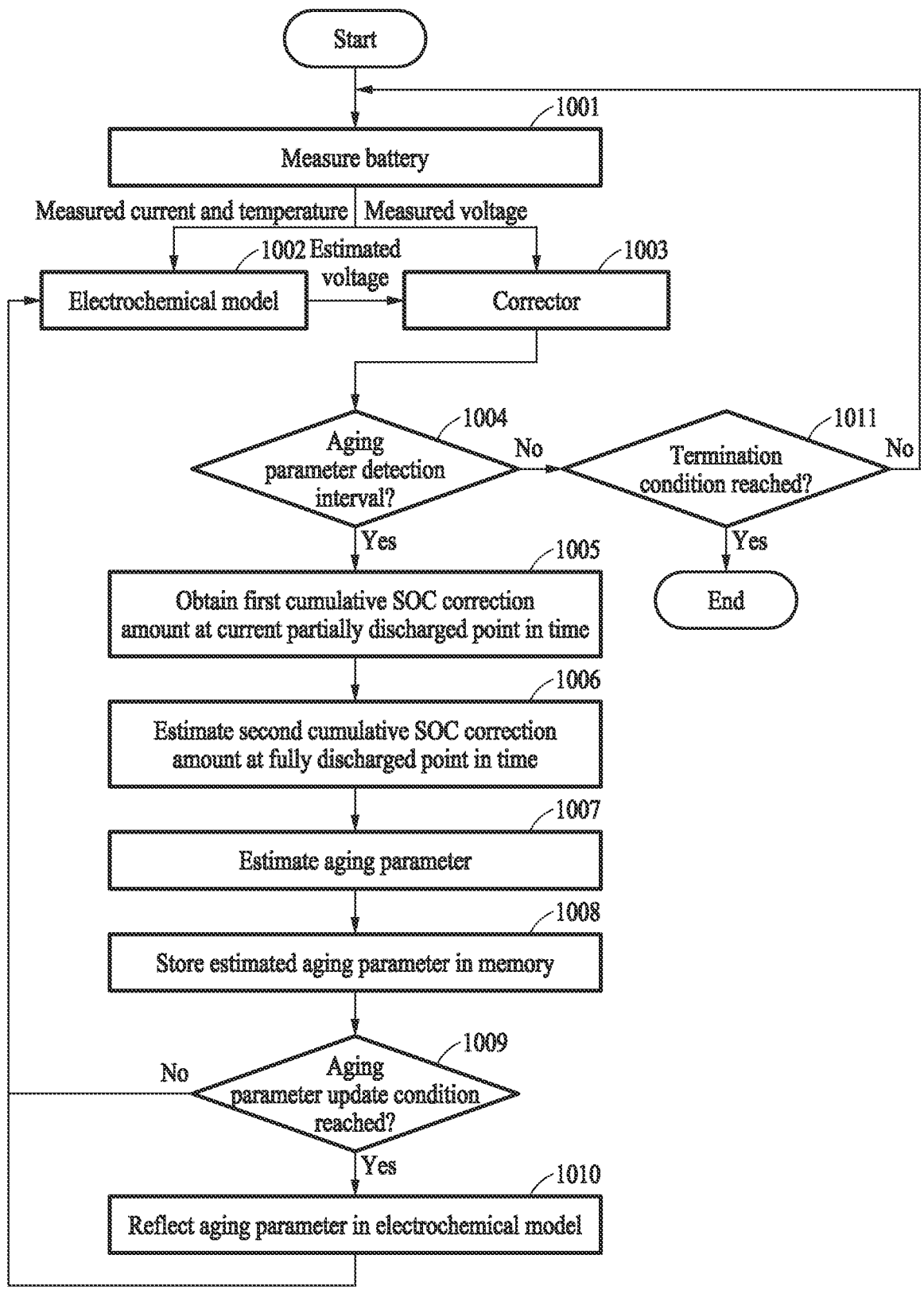
FIG. 10 illustrates an example of estimating a battery state.

FIG. 10 illustrates an example of estimating a battery state. The operations in FIG. 10 may be performed in the sequence and manner as shown, although the order of some operations may be changed or some of the operations omitted without departing from the spirit and scope of the illustrative examples described. Many of the operations shown in FIG. 10 may be performed in parallel or concurrently. One or more blocks of FIG. 10, and combinations of the blocks, can be implemented by special purpose hardware-based computer, such as a processor, that perform the specified functions, or combinations of special purpose hardware and computer instructions. In addition to the description of FIG. 10 below, the descriptions of FIGS. 1-9 are also applicable to FIG. 10, and are incorporated herein by reference. Thus, the above description may not be repeated here.

Referring to FIG. 10, a process of estimating a state of a battery by a battery state estimation apparatus is illustrated.

In operation 1001, the battery state estimation apparatus may measure a battery. For example, the battery state estimation apparatus may measure one of a voltage, a current, and a temperature of the battery, or a combination of two or more thereof. The measured data may be in the form of a profile indicating a change in magnitude over time.

In operation 1002, the battery state estimation apparatus may determine an estimated voltage of the battery and one of state information, such as, for example, SOC, RSOC, SOH, etc., or a combination of two thereof through an electrochemical model. In this example, the electrochemical model may consider one of the current and the temperature measured in operation 1001 or a combination of the two.

In operation 1003, the battery state estimation apparatus may correct one of the SOC value of the battery and an internal state of the electrochemical model or a combination of the two based on a difference between an estimated voltage and the measured voltage through the corrector.

In operation 1004, the battery state estimation apparatus may determine a detection interval for an aging parameter. For example, the battery state estimation apparatus may determine the detection interval for the aging parameter based on an anode stoichiometry (e.g., 0.3 or less) and/or the estimated SOC (e.g., 40% or less) of the battery. Further, based on a correlation between the SOC of the battery and the voltage of the battery, the battery state estimation apparatus may determine the detection interval for the aging parameter based on the estimated voltage of the battery. Hereinafter, for ease of description, an example of determining the detection interval for the aging parameter based on the estimated SOC of the battery and/or the anode stoichiometry will be described. However, this description does not preclude an example of determining the detection interval for the aging parameter based on the estimated voltage of the battery. The aging parameter may include an electrode balance shift for the battery.

In operation 1005, the battery state estimation apparatus may obtain a first cumulative SOC correction amount at a current partially discharged point in time.

In operation 1006, the battery state estimation apparatus may estimate a second cumulative SOC correction amount at a fully discharged point in time from the first cumulative SOC correction amount based on a SOC correction amount prediction curve.

In operation 1007, the battery state estimation apparatus may estimate an aging parameter based on the second cumulative SOC correction amount. The aging parameter may include an electrode balance shift for the battery.

In operation 1008, the battery state estimation apparatus may store the electrode balance shift, which is the estimated aging parameter, in a memory. The memory may be an internal memory of the battery state estimation apparatus or an external memory connected to the battery state estimation apparatus through a wired and/or wireless network.

In operation 1009, the battery state estimation apparatus may determine whether an update condition for the aging parameter is reached. This will be described further with reference to FIG. 11. If the update condition is reached, operation 1010 may be performed next. If the update condition is not reached, operation 1002 may be performed next.

In operation 1010, the battery state estimation apparatus may update an electrode balance shift value of the electrochemical model using one or more aging parameters stored in the memory. This will be described further with reference to FIG. 11.

A portion of or all the model parameters of the electrochemical model may mutually affect, and thus a change in one model parameter may affect another model parameter. The battery state estimation apparatus may further update model parameters other than the electrode balance shift value of the electrochemical model based on the electrode balance shift value.

In operation 1011, the battery state estimation apparatus may determine whether a termination condition is reached. For example, whether the termination condition is reached may be determined based on whether an operation time elapses. If the operation time does not elapse, operation 1001 may be performed. If the operation time elapses, the battery state estimation operation may be terminated.

Through the operation of the battery state estimation apparatus described above, even when the battery is not fully discharged depending on a use pattern or environment of the battery, an electrode balance shift value may be accurately estimated and reflected in the electrochemical model.

Through the electrochemical model reflecting the actual aged state of the battery, it is possible to estimate state information of the battery at high accuracy even in an aged state and to effectively suppress aging accelerated by fast charging or discharging through an accurate state diagnosis of the battery, thereby enhancing the safety of the battery.

Figure 11:
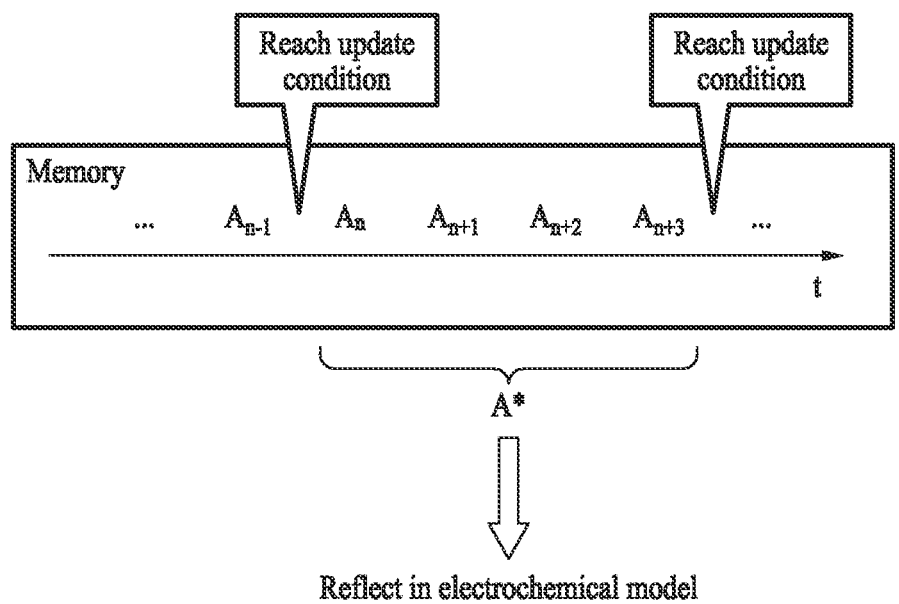
FIG. 11 illustrates an example of updating an aging parameter using one or more individual parameters stored in a memory.

FIG. 11 illustrates an example of updating an aging parameter using one or more individual parameters stored in a memory.

Referring to FIG. 11, an example of storing an individual parameter in a memory each time an individual parameter is estimated and updating an aging parameter of an electrochemical model using one or more individual parameters when an update condition is reached, rather than updating the aging parameter of the electrochemical model immediately based on the estimated individual parameter, is shown. In FIG. 11, An−1, An, . . . , An+3 may be individual parameters that are sequentially estimated. An individual parameter is an electrode balance shift value converted from a second cumulative SOC correction amount, and may be an aging parameter yet to be reflected in an electrochemical model.

For example, when the update condition is reached after an aging variation An+3 is estimated, a final parameter A* to be used for updating the aging parameter may be determined based on one or more individual parameters stored in the memory. For example, the final parameter A* may be determined to be a statistical value (for example, an average value, a moving average value, a median value, a maximum value, etc.) of the individual parameters An, . . . , An+3 between a current point in time at which the update condition is reached and a previous point in time. In another example, the final parameter A* may be determined to be a statistical value of n individual parameters that have been most recently estimated based on the current point in time at which the update condition is reached (n being a natural number). Depending on a circumstance (for example, if n is "5"), the individual parameter (for example, An−1) used in the determination of a previous aging parameter may also be used for this update.

The update condition may be determined based on one of a number of cycles of the battery, a cumulative use capacity of the battery, a cumulative use time of the battery, and a number of individual parameters stored in the memory, or a combination of two or more thereof.

For example, to update an aging parameter of the electrochemical model using multiple individual parameters accumulated as the battery is charged and discharged a number of times, one of the number of cycles of the battery, the cumulative use capacity of the battery, the cumulative use time of the battery, and the number of individual parameters stored in the memory, or a combination of two or more thereof may be used as the update condition. However, the update condition is not limited thereto.

Figure 12:
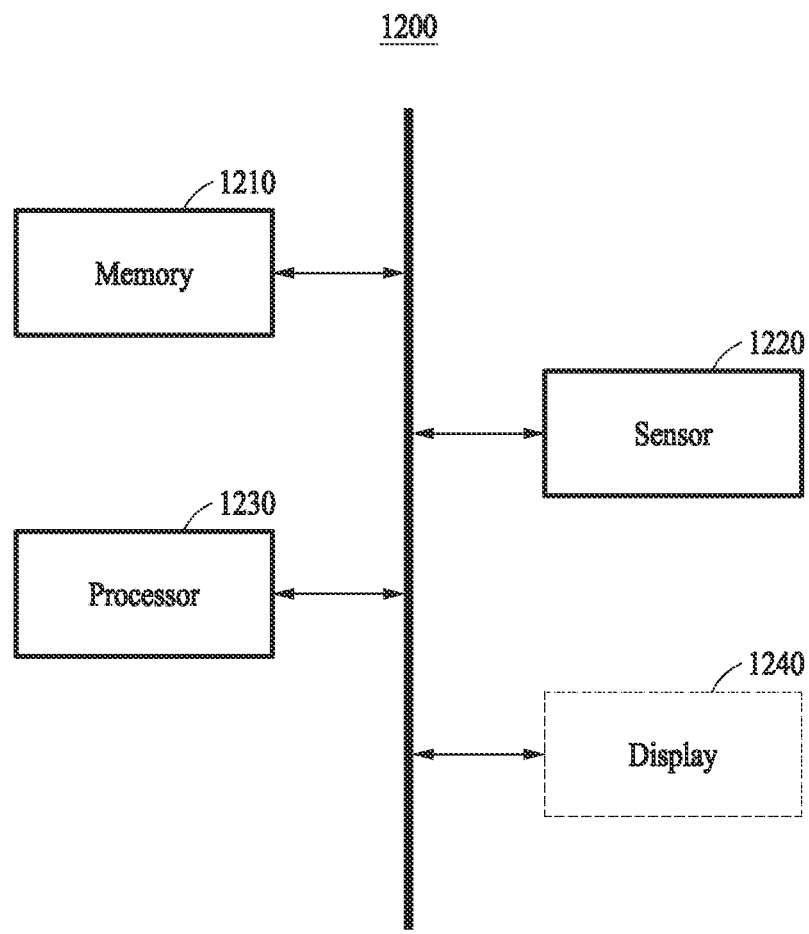
FIG. 12 illustrates an example of an electronic device.

FIG. 12 illustrates an example of an electronic device.

Referring to FIG. 12, an electronic device 1200 includes a memory 1210, a sensor 1220, and a processor 1230. In some examples, the electronic device 1200 may further include a display 1240. The memory 1210, the sensor 1220, the processor 1230, and the display 1240 may communicate with each other through a bus, peripheral component interconnect express (PCIe), or a network on a chip (NoC).

The electronic device 1200 may be a device including a battery management system (BMS) for estimating or monitoring state information of a secondary cell battery or a device using a battery, and include, for example, various computing devices such as a mobile phone, a smart phone, a tablet PC, a laptop, a personal computer (PC), or an e-book device, various wearable devices such as a smart watch, smart eyeglasses, a head mounted display (HMD), or smart clothes, various home appliances such as a smart speaker, a smart television (TV), and a smart refrigerator, and other devices such as a smart vehicle, a smart kiosk, an Internet of things (IoT) device, a walking assist device (WAD), a drone, a robot, and the like. In addition, the electronic device 1200 may be applied to fast charging by battery state estimation, electrochemical model-based automatic aging update, prediction of an internal short circuit of a battery, fuel gauging of a battery, and the like.

The memory 1210 may include computer-readable instructions. The processor 1230 may perform the operations described above when the instructions stored in the memory 1210 are executed by the processor 1230. The memory 1210 may include, for example, a volatile memory or a non-volatile memory. The memory 1210 stores parameters of an electrochemical model corresponding to a battery. Storing a model may indicate storing relationship information between parameters of the model.

The sensor 1220 measures a voltage of the battery. Further, the sensor 1220 may include any one or any combination of a temperature sensor, a current sensor, and a voltage sensor for measuring a current state of the battery. The data measured by the sensor 1220 may be stored in the memory 1210 and/or transmitted to the processor 1230.

The processor 1230 may be a device that executes instructions or programs or that controls the electronic device 1200. The processor 1230 may determine a first cumulative SOC correction amount at a current partially discharged point in time at which a SOC of the battery is corrected by a corrector for reducing a voltage difference between an estimated voltage of the electrochemical model and the measured voltage of the battery, estimate a second cumulative SOC correction amount at a fully discharged point in time from the first cumulative SOC correction amount based on a predetermined SOC correction amount prediction curve, and update an aging parameter of the electrochemical model based on the second cumulative SOC correction amount. Further, the processor 1230 may estimate state information of the battery using the electrochemical model with the aging parameter updated.

The display 1240 may display the state information of the battery estimated using the electrochemical model with the aging parameter updated and/or feedback information according to the state information.

The electronic device 1200 may accurately estimate an electrode balance shift value even when the battery is not fully discharged but partially discharged, thereby expanding a learning area of the electrode balance shift and improving the robustness of an aging estimation operation.

In addition, the electronic device 1200 may process the operations described above.

Figure 13:
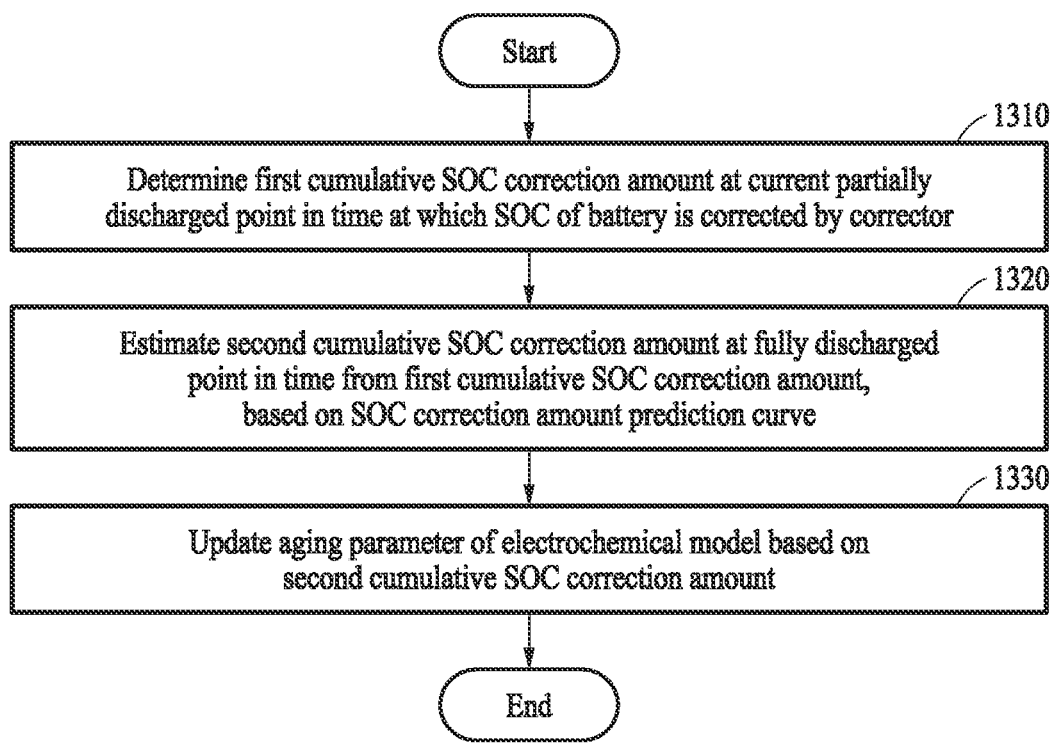
FIG. 13 illustrates an example of an operating method of an electronic device.

FIG. 13 illustrates an example of an operating method of an electronic device. The operations in FIG. 13 may be performed in the sequence and manner as shown, although the order of some operations may be changed or some of the operations omitted without departing from the spirit and scope of the illustrative examples described. Many of the operations shown in FIG. 13 may be performed in parallel or concurrently.

One or more blocks of FIG. 13, and combinations of the blocks, can be implemented by special purpose hardware-based computer, such as a processor, that perform the specified functions, or combinations of special purpose hardware and computer instructions. In an example, operations 1310 to 1330 may be performed by at least one component (e.g., a processor, a sensor, etc.) of the electronic device.

In operation 1310, the electronic device determines a first cumulative SOC correction amount at a current partially discharged point in time at which a SOC of a battery included in the electronic device is corrected by a corrector for reducing a voltage difference between an estimated voltage of an electrochemical model corresponding to the battery and a measured voltage of the battery. In operation 1320, the electronic device estimates a second cumulative SOC correction amount at a fully discharged point in time from the first cumulative SOC correction amount based on a SOC correction amount prediction curve. In operation 1330, the electronic device updates an aging parameter of the electrochemical model based on the second cumulative SOC correction amount.

In addition to the description of FIG. 13 above, the descriptions of FIGS. 1-12 are also applicable to FIG. 13, and are incorporated herein by reference. Thus, the above description may not be repeated here.

Figure 14:
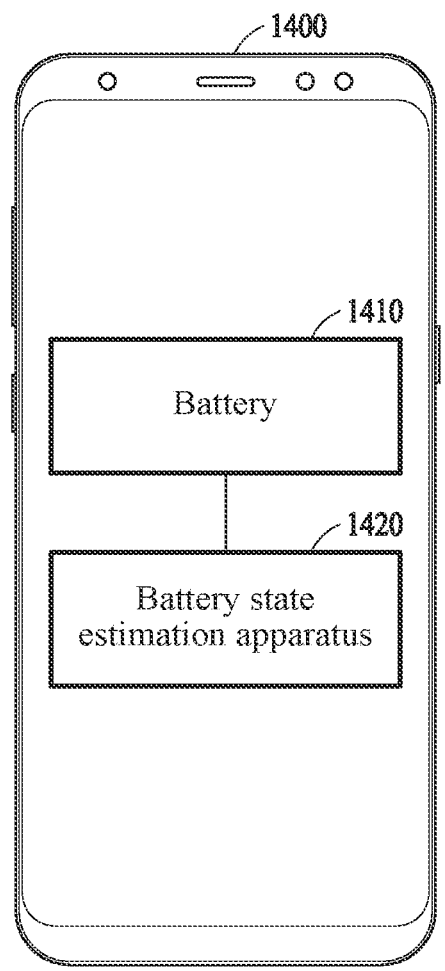
FIG. 14 illustrates an example of a mobile device.

FIG. 14 illustrates an example of a mobile device.

Referring to FIG. 14, a mobile device 1400 includes a battery 1410. The mobile device 1400 may be a device that uses the battery 1410 as a power source. The mobile device 1400 may be a portable terminal, for example, a smart phone. Although FIG. 14 illustrates for ease of description a case in which the mobile device 1400 is a smart phone, various terminals such as a notebook computer, a tablet PC, and a wearable device may be applied thereto without limitation. The battery 1410 includes a BMS and battery cells (or battery modules).

The mobile device 1400 may include a battery state estimation apparatus 1420. The battery state estimation apparatus 1420 may perform an operation of estimating any one or any combination of a current SOC, an unusable SOC, and a RSOC of the battery 1410 using the electrochemical model reflecting the aging parameter described above. The aging parameter may include an electrode balance shift.

The description provided with reference to FIGS. 1 through 13 also applies to the description of FIG. 14, and thus a detailed description will be omitted for conciseness.

Figure 15:
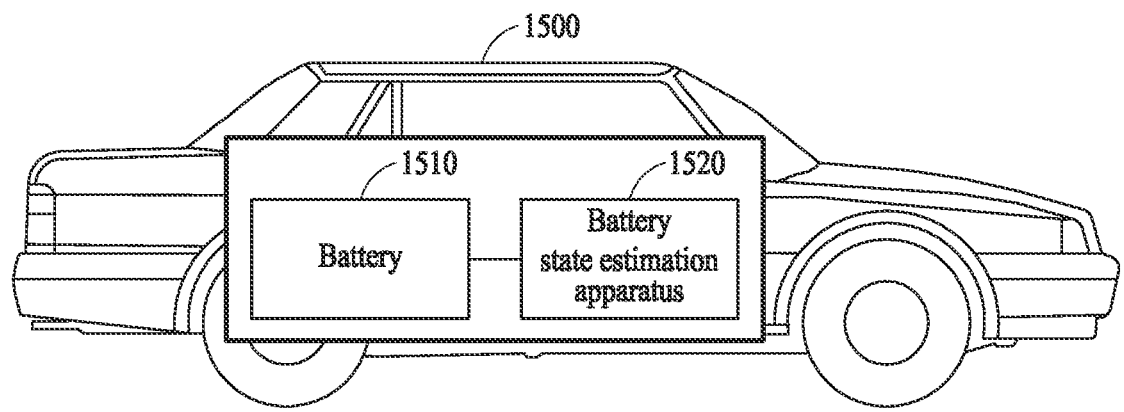
FIG. 15 illustrates an example of a vehicle.

FIG. 15 illustrates an example of a vehicle.

Referring to FIG. 15, a vehicle 1500 may include a battery 1510 and a battery state estimation apparatus 1520. The vehicle 1500 may use the battery 1510 as a power source. The vehicle 1500 may be, for example, an electric vehicle or a hybrid vehicle.

The battery 1510 may include a plurality of battery modules. A battery module may include a plurality of battery cells.

The battery state estimation apparatus 1520 may monitor whether the battery 1510 shows an abnormality and prevent over-charging or over-discharging of the battery 1510. Further, the battery state estimation apparatus 1520 may perform thermal control for the battery 1510 when the temperature of the battery 1510 exceeds a first temperature (e.g., 40° C.) or is less than a second temperature (e.g., −10° C.). In addition, the battery state estimation apparatus 1520 may equalize states of charge of battery cells included in the battery 1510 through cell balancing.

The battery state estimation apparatus 1520 may perform a battery state estimation operation using the electrochemical model reflecting the aging parameter described above. The battery state estimation apparatus 1520 may determine a maximum value, a minimum value, or an average value of state information of the battery cells to be the state information of the battery 1510.

The battery state estimation apparatus 1520 may transmit the state information of the battery 1510 to an electronic control unit (ECU) or a vehicle control unit (VCU) of the vehicle 1500. The ECU or VCU of the vehicle 1500 may output the state information of the battery 1510 through a display of the vehicle 1500.

The description provided with reference to FIGS. 1 through 14 also applies to the description of FIG. 15, and thus a detailed description will be omitted for conciseness.

The battery state estimation apparatus 1420, the battery state estimation apparatus 1520, the corrector 420, and other apparatuses, devices, units, modules, and components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a controller and an arithmetic logic unit (ALU), a DSP, a microcomputer, an application-specific integrated circuit (ASIC), a field programmable gate array (FPGA), a programmable logic unit (PLU), a central processing unit (CPU), a graphics processing unit (GPU), a neural processing unit (NPU), or any other device capable of responding to and executing instructions in a defined manner.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. In an example, the instructions or software includes at least one of an applet, a dynamic link library (DLL), middleware, firmware, a device driver, an application program storing the method of operating the electronic device. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), magnetic RAM (MRAM), spin-transfer torque (STT)-MRAM, static random-access memory (SRAM), thyristor RAM (T-RAM), zero capacitor RAM (Z-RAM), twin transistor RAM (TTRAM), conductive bridging RAM (CBRAM), ferroelectric RAM (FeRAM), phase change RAM (PRAM), resistive RAM (RRAM), nanotube RRAM, polymer RAM (PoRAM), nano floating gate Memory (NFGM), holographic memory, molecular electronic memory device), insulator resistance change memory, dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. In an example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. An electronic device, comprising:
a memory configured to store parameters of an electrochemical model corresponding to a battery;
a sensor configured to measure a voltage of the battery; and
a processor configured to
determine a first cumulative state of charge (SOC) correction amount at a partially discharged point in time at which a SOC of the battery is corrected by a corrector for reducing a voltage difference between an estimated voltage of the electrochemical model and the measured voltage of the battery,
estimate a second cumulative SOC correction amount at a fully discharged point in time based on the first cumulative SOC correction amount and a SOC correction amount prediction curve, and
update an aging parameter of the electrochemical model based on the second cumulative SOC correction amount.

2. The electronic device of claim 1, wherein the SOC correction amount prediction curve is determined based on a cumulative voltage difference curve determined by:
determining a voltage difference curve between the estimated voltage of the electrochemical model and the measured voltage of the battery based on a change in an anode potential according to aging of the battery; and
determining a cumulative voltage difference curve obtained by accumulating voltage differences from a point in time at which the voltage difference increases in the voltage difference curve.

3. The electronic device of claim 2, wherein the SOC correction amount prediction curve is determined based on fixing the voltage difference curve according to the battery and that a cumulative voltage correction amount corresponds to a cumulative SOC correction amount.

4. The electronic device of claim 2, wherein the point in time at which the voltage difference increases in the voltage difference curve comprises:
a point in time at which an anode stoichiometry of the battery is between 0.3 and 0.4, inclusive; or
a point in time at which the SOC of the battery is between 30% and 40%, inclusive.

5. The electronic device of claim 1, wherein the processor is further configured to determine the second cumulative SOC correction amount, based on:
the first cumulative SOC correction amount;
a third cumulative SOC correction amount corresponding to a battery state at the partially discharged point in time in the SOC correction amount prediction curve; and
a fourth cumulative SOC correction amount corresponding to a battery state at the fully discharged point in time in the SOC correction amount prediction curve.

6. The electronic device of claim 1, wherein the processor is further configured to determine the first cumulative SOC correction amount by the corrector from a point in time at which the voltage difference increases to the partially discharged point in time.

7. The electronic device of claim 1, wherein the SOC correction amount prediction curve is determined based on a cumulative voltage difference curve determined by:
determining a voltage difference curve between a measured voltage of the battery in a fresh state and an estimated voltage of a large-capacity model having a larger capacity than the electrochemical model; and
determining a cumulative voltage difference curve obtained by accumulating voltage differences, based on a graph below a designated battery state in the voltage difference curve.

8. The electronic device of claim 1, wherein the processor is further configured to:
store a parameter determined based on the second cumulative SOC correction amount in the memory, and
update the aging parameter of the electrochemical model using one or more parameters stored in the memory, in response to an update condition for the aging parameter being reached.

9. The electronic device of claim 1, wherein the aging parameter comprises an electrode balance shift for the battery.

10. The electronic device of claim 1, wherein the processor is further configured to estimate state information of the battery using the electrochemical model with the updated aging parameter.

11. A processor-implemented method of operating an electronic device, the operating method comprising:
determining a first cumulative state of charge (SOC) correction amount at a partially discharged point in time at which a SOC of a battery included in the electronic device is corrected by a corrector for reducing a voltage difference between an estimated voltage of an electrochemical model corresponding to the battery and a measured voltage of the battery;
estimating a second cumulative SOC correction amount at a fully discharged point in time based on the first cumulative SOC correction amount and a SOC correction amount prediction curve; and updating an aging parameter of the electrochemical model based on the second cumulative SOC correction amount.

12. The operating method of claim 11, wherein the SOC correction amount prediction curve is determined based on a cumulative voltage difference curve determined by:
   determining a voltage difference curve between the estimated voltage of the electrochemical model and the measured voltage of the battery based on a change in an anode potential according to aging of the battery; and
   determining a cumulative voltage difference curve obtained by accumulating voltage differences from a point in time at which the voltage difference increases in the voltage difference curve.

13. The operating method of claim 12, wherein the SOC correction amount prediction curve is determined based on fixing the voltage difference curve according to the battery and that a cumulative voltage correction amount corresponds to a cumulative SOC correction amount.

14. The operating method of claim 12, wherein the point in time at which the voltage difference increases in the voltage difference curve comprises:
   a point in time at which an anode stoichiometry of the battery is between 0.3 and 0.4, inclusive; or
   a point in time at which the SOC of the battery is between 30% and 40%, inclusive.

15. The operating method of claim 11, wherein the estimating of the second cumulative SOC correction amount comprises determining the second cumulative SOC correction amount, based on
   the first cumulative SOC correction amount;
   a third cumulative SOC correction amount corresponding to a battery state at the partially discharged point in time in the SOC correction amount prediction curve; and
   a fourth cumulative SOC correction amount corresponding to a battery state at the fully discharged point in time in the SOC correction amount prediction curve.

16. The operating method of claim 11, wherein the determining of the first cumulative SOC correction amount comprises determine the first cumulative SOC correction amount by the corrector from a point in time at which the voltage difference increases to the partially discharged point in time.

17. The operating method of claim 11, wherein the SOC correction amount prediction curve is determined based on a cumulative voltage difference curve determined by:
   determining a voltage difference curve between a measured voltage of the battery in a fresh state and an estimated voltage of a large-capacity model having a larger capacity than the electrochemical model; and
   determining a cumulative voltage difference curve obtained by accumulating voltage differences, based on a graph below a designated battery state in the voltage difference curve.

18. The operating method of claim 11, further comprising:
   storing a parameter determined based on the second cumulative SOC correction amount in a memory, and
   updating the aging parameter of the electrochemical model using one or more parameters stored in the memory, in response to an update condition for the aging parameter being reached.

19. The operating method of claim 11, wherein the aging parameter comprises an electrode balance shift for the battery.

20. A non-transitory computer-readable storage medium storing instructions that, when executed by a processor, cause the processor to perform the operating method of claim 11.

* * * * *